US010014132B2

(12) United States Patent
Hinooka et al.

(10) Patent No.: US 10,014,132 B2
(45) Date of Patent: Jul. 3, 2018

(54) ELECTRONIC DEVICE

(71) Applicant: CASIO COMPUTER CO., LTD., Shibuya-ku, Tokyo (JP)

(72) Inventors: Takashi Hinooka, Hachioji (JP); Chihaya Sakata, Ome (JP); Shinichi Tamamoto, Tokyo (JP); Atsushi Tsuchiya, Fussa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 9 days.

(21) Appl. No.: 14/991,136

(22) Filed: Jan. 8, 2016

(65) Prior Publication Data

US 2016/0225550 A1     Aug. 4, 2016

(30) Foreign Application Priority Data

Jan. 30, 2015   (JP) ................................ 2015-016576

(51) Int. Cl.
| H01H 9/26 | (2006.01) |
| H01H 13/72 | (2006.01) |
| H01H 13/76 | (2006.01) |
| H01H 13/7057 | (2006.01) |
| H05K 5/00 | (2006.01) |
| H05K 5/06 | (2006.01) |

(Continued)

(52) U.S. Cl.
CPC ....... *H01H 13/7057* (2013.01); *G06F 1/1656* (2013.01); *G06F 1/1662* (2013.01); *G06F 15/02* (2013.01); *H05K 5/0017* (2013.01); *H05K 5/061* (2013.01); *H01H 2223/002* (2013.01); *H01H 2223/034* (2013.01); *H01H 2223/04* (2013.01); *H01H 2231/002* (2013.01)

(58) Field of Classification Search
CPC ........ G06F 1/16; H05K 5/0017; H05K 5/061; H01H 13/7057; H01H 2223/002; H01H 2223/04; H01H 2223/034; H01H 2231/002
USPC ........................................................ 200/5 A
See application file for complete search history.

(56) References Cited

U.S. PATENT DOCUMENTS 5,612,692 A * 3/1997 Dugas ................. H01H 13/705
                                                            200/5 B
8,559,182 B2    10/2013 Ohira
(Continued)

FOREIGN PATENT DOCUMENTS

| JP | 59155624 U | 10/1984 |
| JP | 2003131789 A | 5/2003 |

(Continued)

OTHER PUBLICATIONS

Japanese Office Action (and English translation thereof) dated May 24, 2016, issued in counterpart Japanese Application No. 2015-016576.

*Primary Examiner* — Edwin A. Leon
*Assistant Examiner* — Lheiren Mae A Caroc
(74) *Attorney, Agent, or Firm* — Holtz, Holtz & Volek PC

(57) ABSTRACT

An electronic device includes a casing having an opening; a circuit board having a plurality of electrodes, which is provided inside the casing; a contact member having a plurality of contact points corresponding to the electrodes, which is provided so as to seal the opening; and a key unit (press-key unit) having a key operation unit corresponding to the contact points, which is provided to the opening. The key unit (press-key unit) is attached to the opening detachably.

13 Claims, 15 Drawing Sheets

(51) Int. Cl.
*G06F 15/02* (2006.01)
*G06F 1/16* (2006.01)

(56) References Cited

U.S. PATENT DOCUMENTS

2003/0080880 A1    5/2003  Kaino et al.
2016/0293357 A1*  10/2016  Oshima ................ H01H 13/705

FOREIGN PATENT DOCUMENTS

| JP | 2003258450 A | 9/2003 |
| JP | 2012043082 A | 3/2012 |

* cited by examiner

ELECTRONIC DEVICE

BACKGROUND

1. Technical Field

The present invention relates to an electronic device.

2. Related Art

Various types of technologies concerning waterproof and dustproof structures of electronic devices have been proposed (for example, JP 2012-43082 A).

JP 2012-43082 A discloses an electronic calculator equipped with a device module and a device casing. The device module includes a key input unit, a display, and a solar panel which are wrapped in a sheet member and sealed in a state where they are electrically connected with a circuit board. The device module is incorporated in the device casing.

According to the electronic calculator, waterproof property and dustproof property of the device module can be secured with a simple structure.

However, according to the technology disclosed in JP 2012-43082 A, dusts or the like may enter from the gap between the key top and the device casing, causing an input failure due to clogging in the electronic calculator. As such, in order to remove dusts or the like entered inside, an electronic calculator which can be disassembled and cleaned is desirable.

SUMMARY

An embodiment described herein has been made in consideration of such a situation. An object of the present embodiment is to provide an electronic device which can be disassembled and cleaned so as to remove dusts or the like entered inside.

An electronic device of the present invention includes: a casing having an opening; a circuit board having a plurality of electrodes, the circuit board being provided inside the casing; a contact member having a plurality of contact points corresponding to the electrodes, the contact member being provided so as to seal the opening; and a key unit having a key operation unit corresponding to the contact points, the key unit being provided to the opening, and the key unit is attached to the opening in an attachable and detachable manner.

According to the present embodiment, an electronic device is able to be disassembled and cleaned, whereby it is possible to easily remove dusts or the like entered inside.

DETAILED DESCRIPTION

Hereinafter, as a mode for carrying out the present invention (hereinafter referred to as an "embodiment"), a structure in which an electronic device is applied to an electronic calculator is described with reference to the accompanying drawings. It should be noted that the same elements are denoted by the same numerals through the entire description of the embodiment. Further, in the embodiment and the drawings, "right", "left", "up", and "down" indicate "right", "left", "up", and "down" in the case of facing an electronic device, respectively. Further, in the embodiment and the drawings, "front side" indicates a "forward" direction in the case of facing an electronic device, and "back side" indicates a "backward" direction in the case of facing an electronic device.

(Overall Configuration of Electronic Calculator)

First, the overall configuration of an electronic calculator 10 will be described based on FIGS. 1 to 3.

Figure 1:
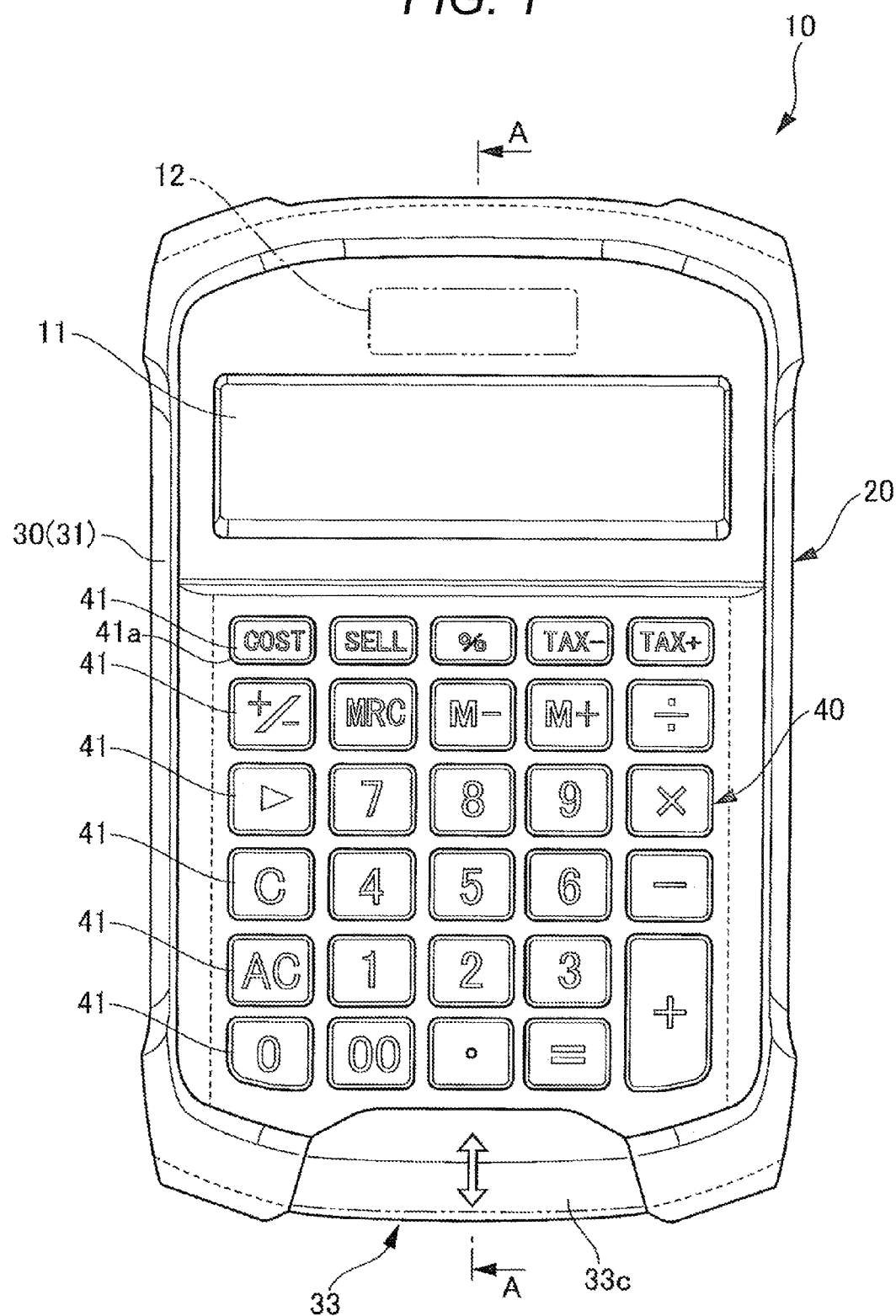
FIG. 1 is a plan view of an electronic calculator according to an embodiment of the present invention.

As shown in FIG. 1, the electronic calculator 10 is an approximately flat plate-shaped electronic device used for performing four arithmetic operations, mixture thereof, application calculation, and the like. The electronic calculator 10 includes a main body 20 having a display 11, and a press-key unit 40 provided as an input unit in the front lower portion of the main body 20.

The display 11 includes a display screen formed of a planar display element such as a liquid-crystal display element, an EL (electroluminescence) display element, or the like. The display screen electro-optically displays numbers, characters, and signs representing information input from the press-key unit 40, arithmetic processing results, and the like. The upper side of the display 11 may be provided with a solar panel 12 which receives external light and generates power.

Figure 2:
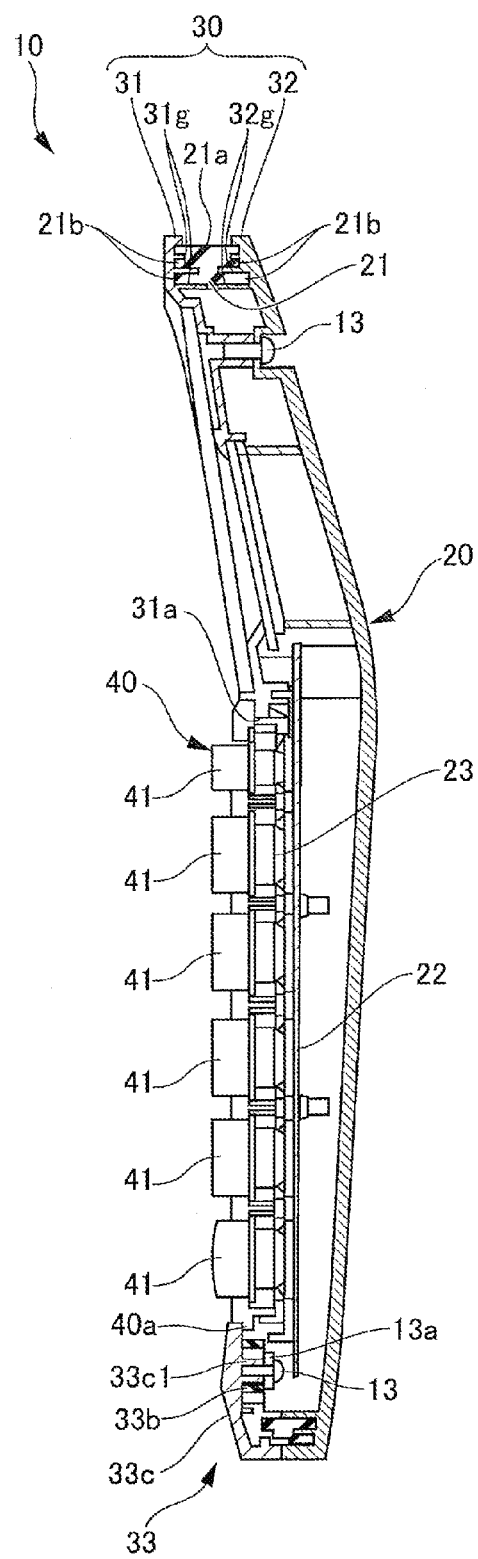
FIG. 2 is a sectional view taken along a line A-A of FIG. 1.

As shown in FIG. 2, the main body 20 includes a casing 30 configured of a front-side casing 31 having an opening 31a and a back-side casing 32 which constitutes the entire casing 30 by being joined with the front-side casing 31. The casing 30 includes a lock unit 33 provided on the lower side of the opening 31a, in the lower portion thereof. The lock unit 33 may be provided on the left side or the right side, rather than the lower side of the opening 31a of the casing 30.

Figure 3:
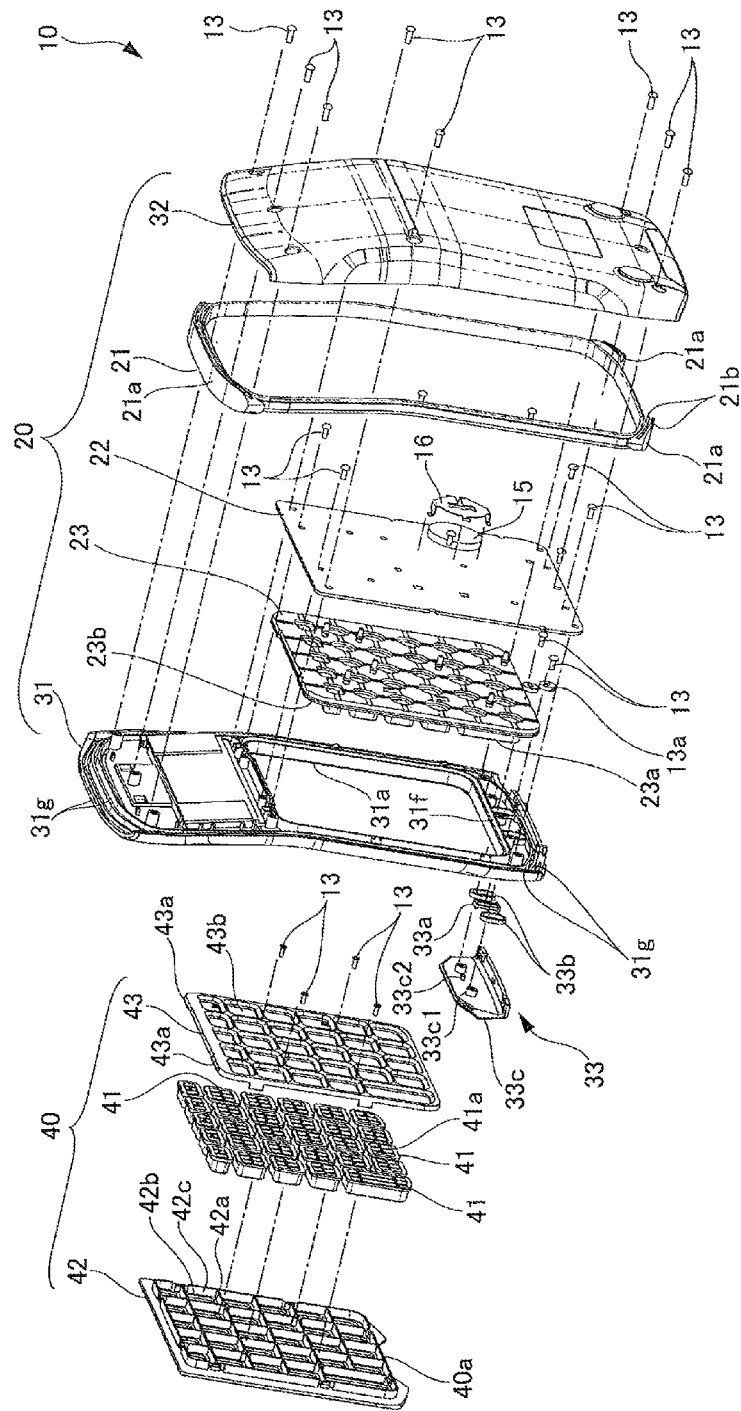
FIG. 3 is an exploded perspective view of the electronic calculator illustrated in FIG. 1.

Further, as shown in FIG. 3, the main body 20 includes a packing member 21 interposed between the front-side casing 31 and the back-side casing 32, a circuit board 22 provided inside the casing 30, and a contact member 23 having a plurality of contact points 23a and provided so as to seal the opening 31a.

In the electronic calculator 10, the press-key unit 40 includes a plurality of press keys 41 each having a flange 41a as a key operation unit, and a front-side frame 42 and a back-side frame 43. The press keys 41, the front-side frame 42, and the back-side frame 43 are fixed with screws 13 or the like to constitute one unit which is attached to the opening 31a detachably. The lock unit 33 is slidable in a direction orthogonal to the lower side of the opening 31a, and has a function of locking a lower side 40a of the press-key unit 40. The lock unit 33 includes a locking piece 33a, an O ring 33b, and a lock cover 33c.

(Configurations of Respective Units of Electronic Calculator)

Next, configurations of respective units of the electronic calculator 10 will be described based on FIGS. 4A to 14B.

Figure 4A:
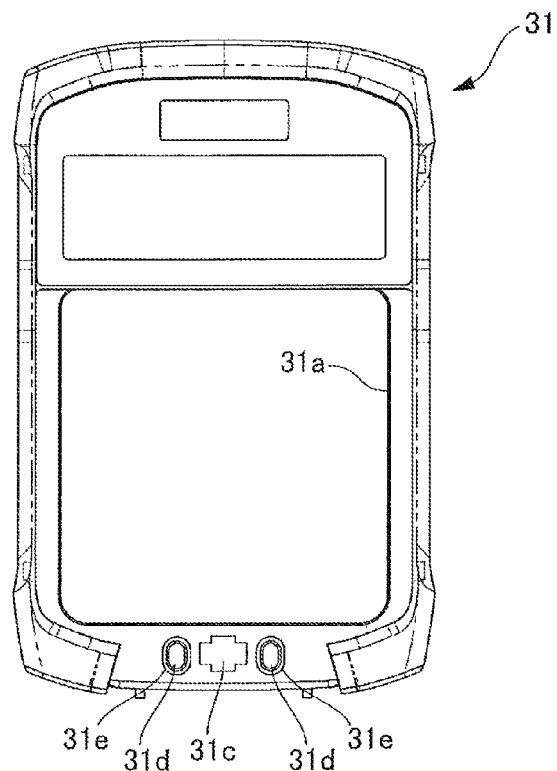
FIG. 4A is a plan view of a front-side casing according to the embodiment.
Figure 4B:
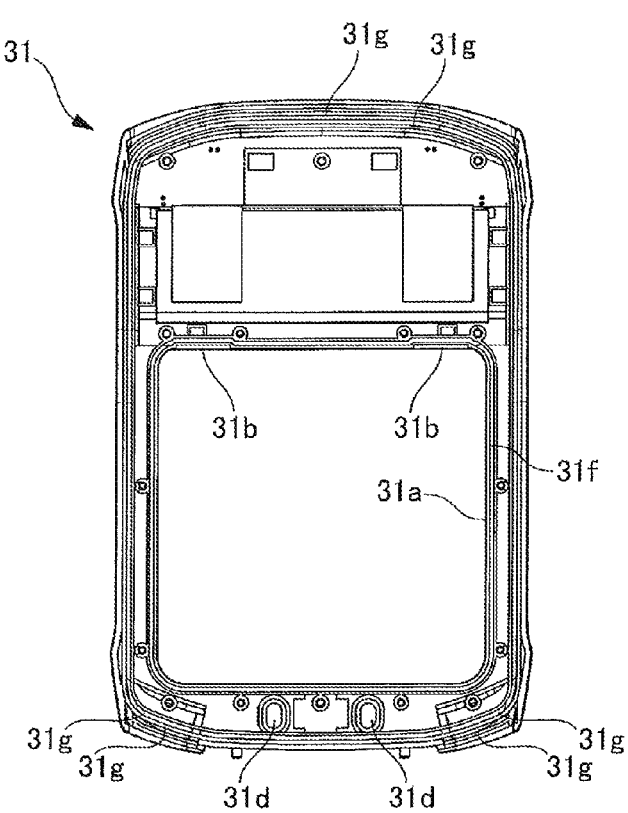
FIG. 4B is a rear view of the front-side casing.

As shown in FIGS. 4A and 4B, the front-side casing 31 has the approximately square opening 31a, and includes a pair of right and left engagement portions 31b on the upper edge of the opening 31a. The engagement portion 31b is in a recessed shape, and causes a protrusion 43a (described below), which is an engagement portion of the back-side frame 43 of the press-key unit 40, to engage with the upper edge of the opening 31a. The front-side casing 31 also includes a recess 31c formed on the lower edge of the opening 31a, and a pair of long holes 31d provided on both right and left sides of the recess 31c. Each of the long holes 31d has an edge 31e to receive the O ring 33b (see FIG. 3).

The front-side casing 31 also has a groove 31f having a U-shaped cross section around the opening 31a. Further, on the periphery of the front-side casing 31, a groove 31g for fitting the packing member 21 (see FIG. 3) is formed. In the front-side casing 31, at locations corresponding to portions 21a (described below) where the packing member 21 is exposed (in this example, the entire upper portion of the front-side casing 31 and both end portions of the lower portion of the front-side casing 31), the grooves 31g are formed in a plurality of layers.

Figure 5A:
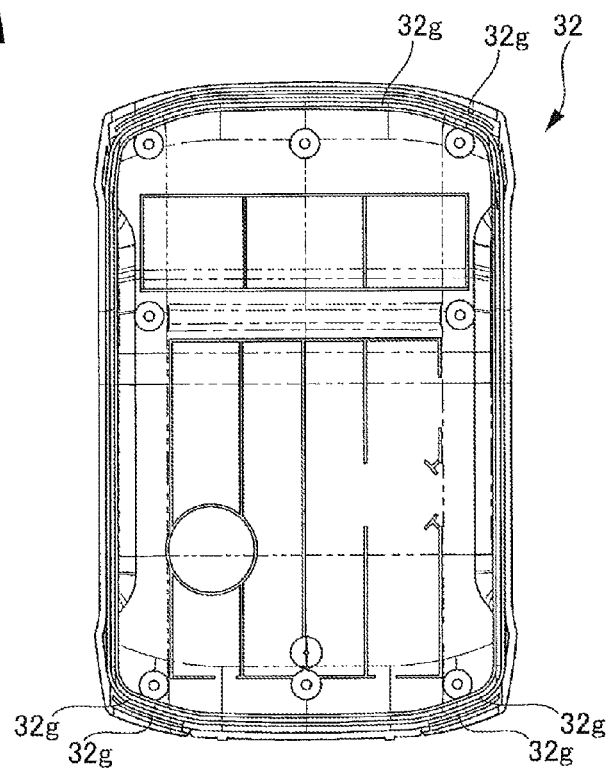
FIG. 5A is a plan view of a back-side casing according to the embodiment.
Figure 5B:
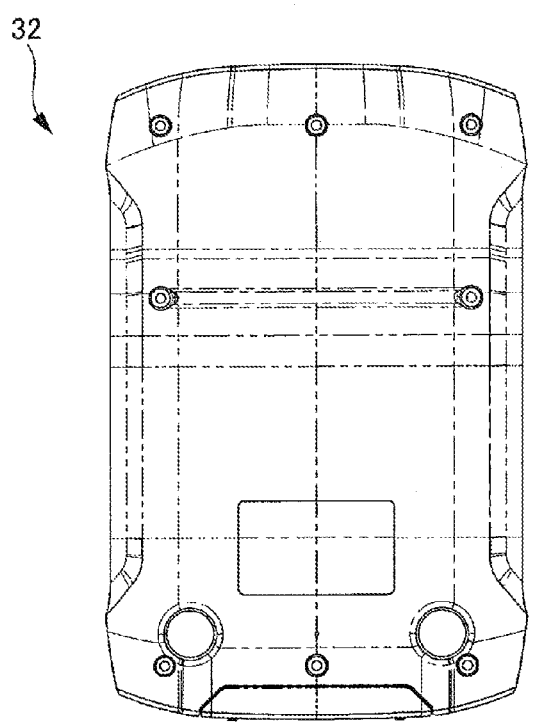
FIG. 5B is a rear view of the back-side casing.

As shown in FIGS. 5A and 5B, the back-side casing 32 is formed to have a shape to be joined from the back side of the front-side casing 31 (see FIG. 3). On the periphery of the back-side casing 32, a groove 32g for fitting the packing member 21 is formed. In the back-side casing 32, at locations corresponding to the portions 21a (described below) where the packing member 21 is exposed (in this example, the entire upper portion of the back-side casing 32 and both end portions of the lower portion of the back-side casing 32), the grooves 32g are formed in a plurality of layers, similar to the front-side casing 31 (see FIG. 4B). The back-side casing 32 is configured to be fixed to the back side of the front-side casing 31 with the screws 13 (see FIG. 3) so as to interpose the packing member 21 (see FIG. 3) between it and the front-side casing 31.

Figure 6A:
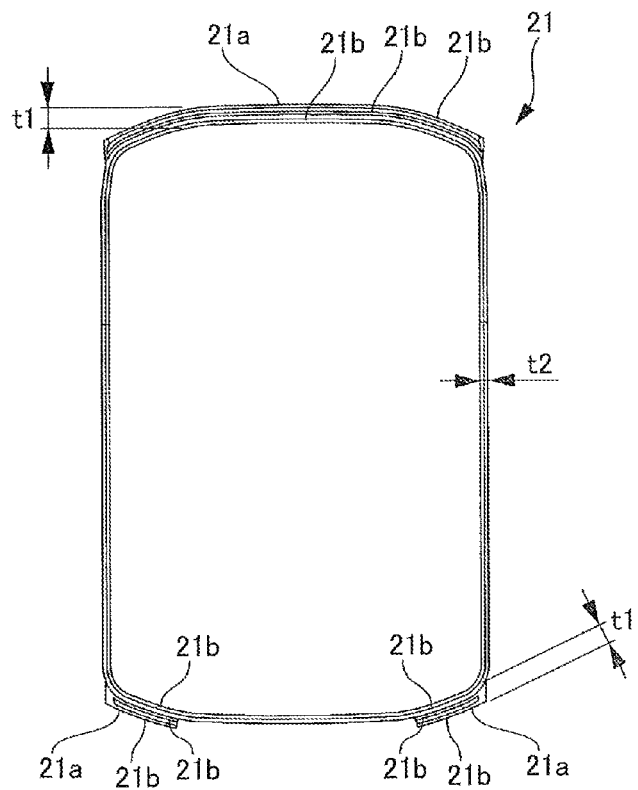
FIG. 6A is a plan view of a packing member according to the embodiment.
Figure 6B:
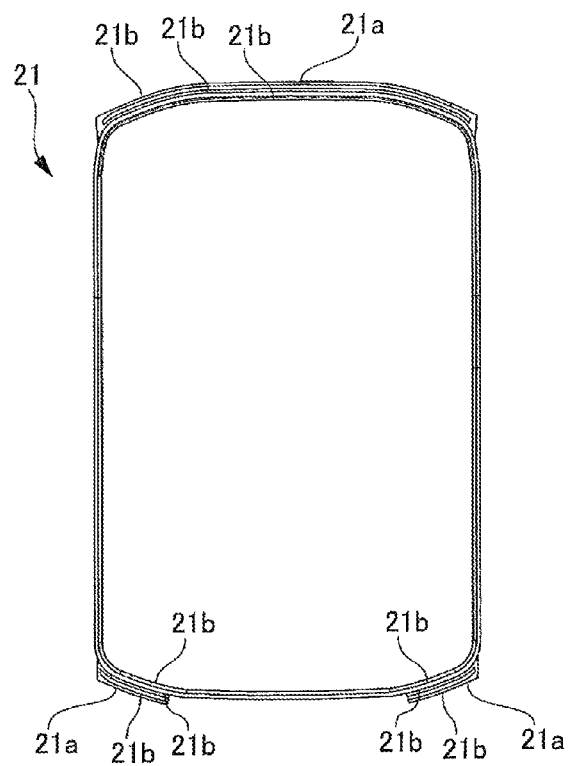
FIG. 6B is a rear view of the packing member.

As shown in FIGS. 6A and 6B, the packing member 21 is exposed so as to be visible from the outside at portions of the upper side and the lower side of the casing 30 (see FIG. 2) (in this example, the entire upper portion of the casing 30 and both end portions of the lower portion of the casing 30). A thickness t1 of the exposed portions 21a is made thicker than a thickness t2 of the unexposed portion. Further, the portions where the thickness t1 of the packing member 21 is made thicker have a plurality of linear ribs 21b corresponding to the grooves 31g (see FIG. 4B) and the grooves 32g (see FIG. 5A) formed in a plurality of layers in the front-side casing 31 and the back-side casing 32.

Figure 7A:
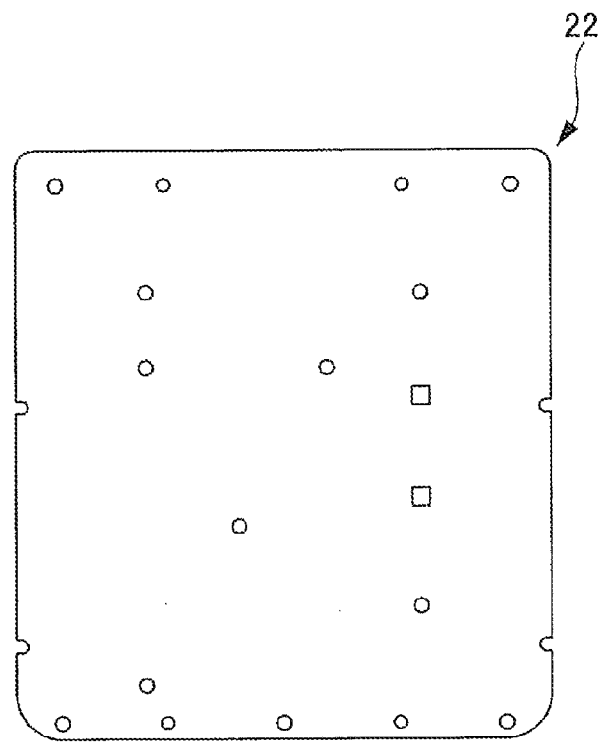
FIG. 7A is a plan view of a circuit board according to the embodiment.
Figure 7B:
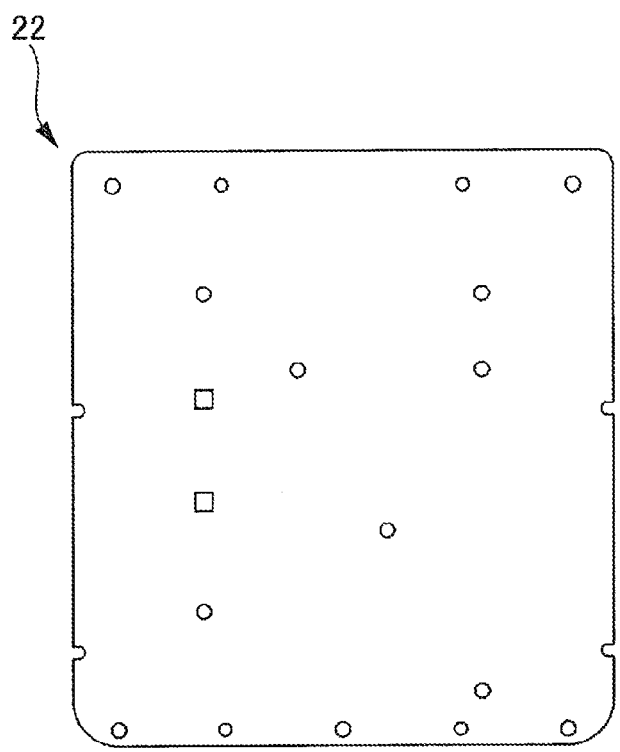
FIG. 7B is a rear view of the circuit board.

As shown in FIGS. 7A and 7B, the circuit board 22 has an approximately square outer shape. The circuit board 22 is provided with a plurality of electrodes (not shown). The circuit board 22 is configured such that a contact point 23a (described below) of the contact member 23 is pressed to an electrode so that the electrode is energized, whereby the pressed key of the press keys 41 (see FIG. 3) is detected. Further, on the rear side of the circuit board 22, an auxiliary battery 15 (see FIG. 3) is held by a holding member 16 (see FIG. 3). The auxiliary battery 15 functions as a back-up battery which is used at a dark place where the solar panel 12 (see FIG. 1) is difficult to function (for example, in a building under construction). The rear side of the circuit board 22 is also provided with a processor (not shown) which performs operation of the calculator according to a press of a key. The circuit board 22, configured as described above, is formed such that after the contact member 23 (see FIG. 3) is attached to the front face thereof, it is fixed to the rear side of the front-side casing 31 with the screws 13 (see FIG. 3) so as to interpose the contact member 23 between it and the front-side casing 31 (see FIG. 3).

Figure 8A:
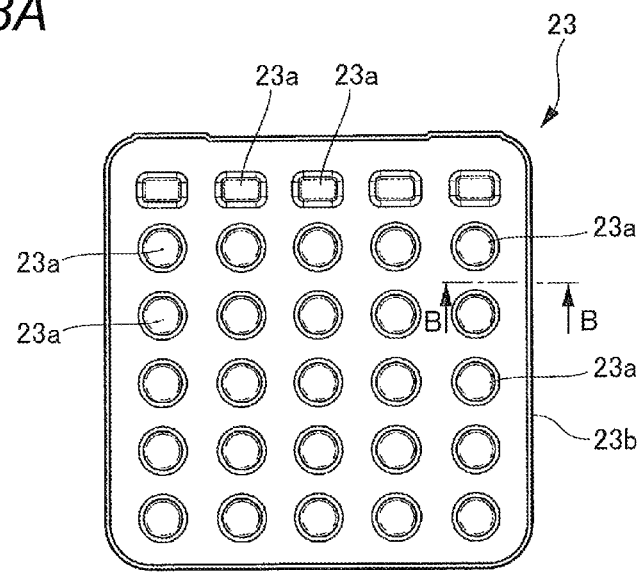
FIG. 8A is a plan view of a contact member according to the embodiment.
Figure 8B:
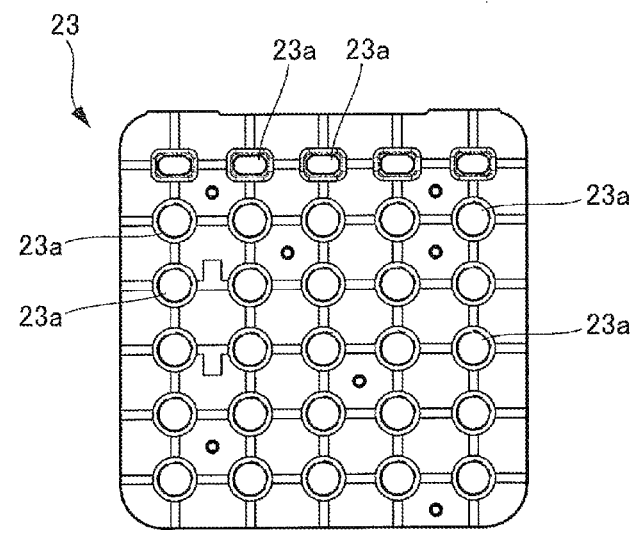
FIG. 8B is a rear view of the contact member.

As shown in FIGS. 8A and 8B, the contact member 23 has an approximately square outer shape corresponding to the outer shape of the circuit board 22 (see FIG. 7). The contact member 23 includes a plurality of contact points 23a corresponding to the electrodes of the circuit board 22, and is provided so as to seal the opening 31a (see FIG. 3). The respective contact points 23a are provided to project to the front side. The contact member 23 also includes an outer peripheral rib 23b formed around the outer periphery. The outer peripheral rib 23b is inserted in a U-shaped groove 31f (see FIG. 4B) of the front-side casing 31. As the material constituting the contact member 23, an elastic material such as rubber is used suitably.

Figure 9A:
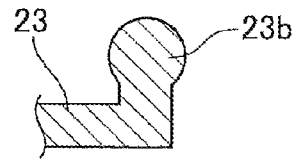
FIG. 9A is a sectional view taken along a line B-B of FIG. 8A.

As shown in FIG. 9A, the outer peripheral rib 23b is formed such that the tip portion is in a partial spherical shape in a sectional view and has a width larger than that of the base end side thereof. Thereby, as shown in FIG. 9B, the outer peripheral rib 23b seals the gap with the U-shaped groove 31f in a state of being compressed from three directions.

Figure 9B:
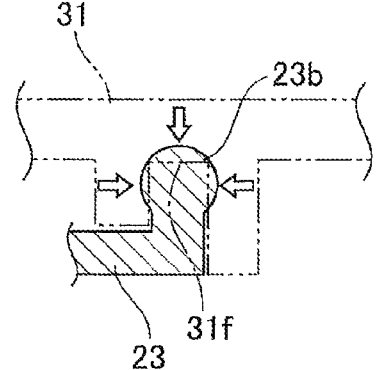
FIG. 9B is an action diagram of FIG. 9A.
Figure 9C:
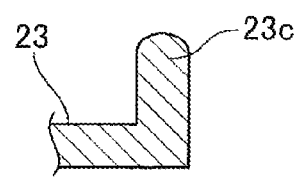
FIG. 9C is a sectional view of an outer peripheral rib according to a comparative example.
Figure 9D:
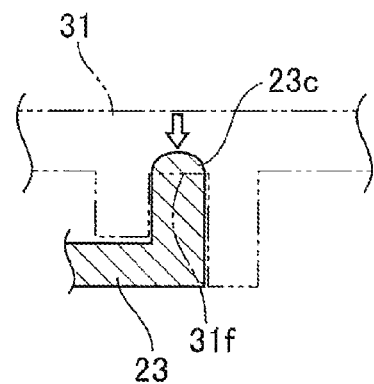
FIG. 9D is an action diagram of FIG. 9C.

Meanwhile, as shown in FIG. 9C, it is also possible to have an outer peripheral rib 23c in which only an end surface thereof is in a protruding curved surface shape to thereby seal the gap between the outer peripheral rib 23c and the U-shaped groove 31f. In that case, however, as shown FIG. 9D, as the gap between the outer peripheral rib 23c and the U-shaped groove 31f is sealed in a state where the outer peripheral rib 23c is compressed from only one direction, it is difficult to obtain a high sealing property.

In this point, in the case of the outer peripheral rib 23b, as the outer peripheral rib 23b can be compressed from three directions as shown in FIG. 9B, it is possible to further reduce the gap caused between the outer peripheral rib 23b and the U-shaped groove 31f. Consequently, a high sealing property can be obtained.

Figure 10A:
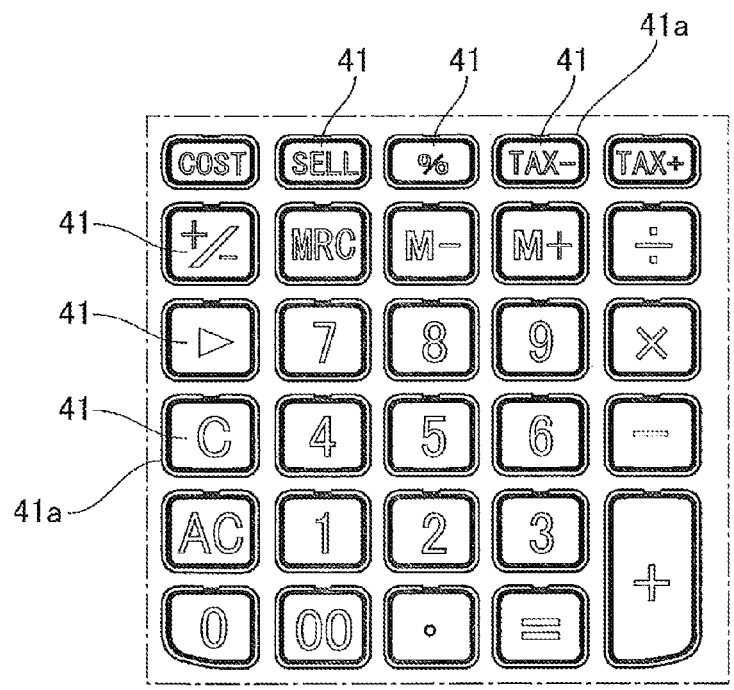
FIG. 10A is a plan view of press keys according to the embodiment.
Figure 10B:
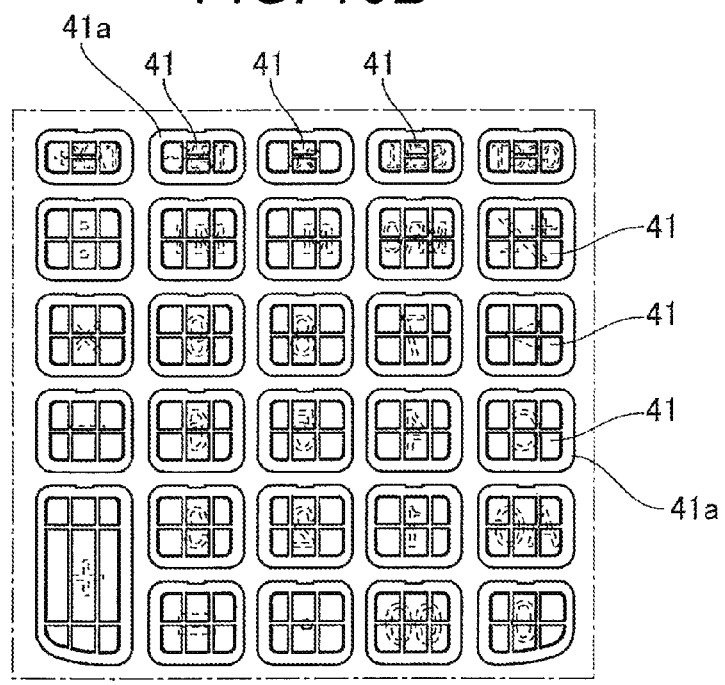
FIG. 10B is a rear view of the press keys.

As shown in FIGS. 10A and 10B, the press keys 41 are arranged corresponding to the contact points 23a (see FIG. 8A), and each of the press keys 41 has a flange 41a on the back end.

Figure 11A:
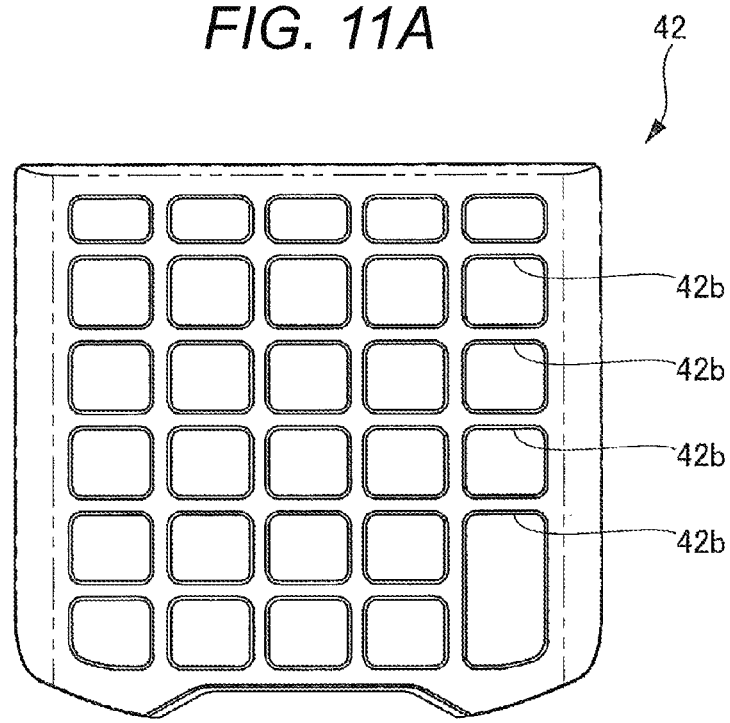
FIG. 11A is a plan view of a front-side frame according to the embodiment.
Figure 11B:
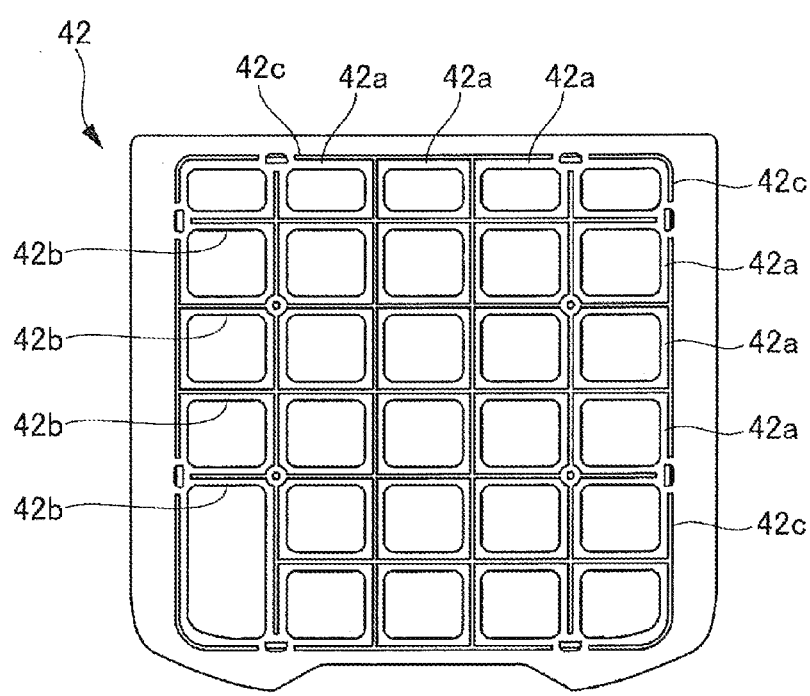
FIG. 11B is a rear view of the front-side frame.

As shown in FIGS. 11A and 11B, the front-side frame 42 includes an edge 42a which receives the flange 41a (see FIG. 10) of the press key 41, a front-side opening 42b in which the tip end of the press key 41 is inserted, and a rib 42c, provided around the front-side opening 42b, for securing a stroke when the press key 41 is pressed.

Figure 12A:
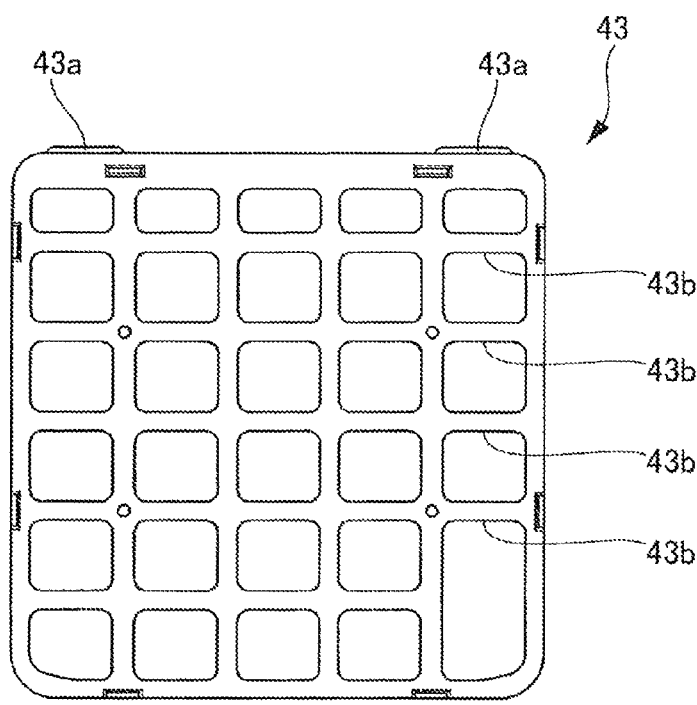
FIG. 12A is a plan view of a back-side frame according to the embodiment.
Figure 12B:
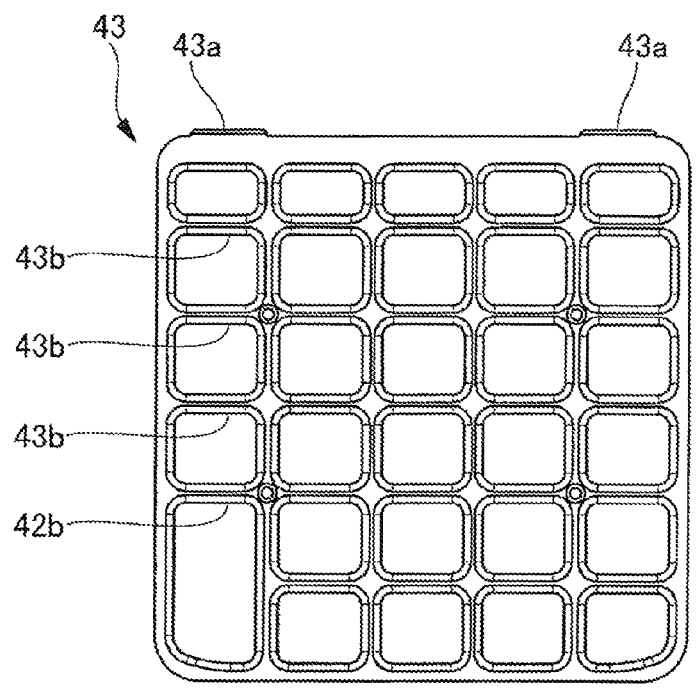
FIG. 12B is a rear view of the back-side frame.

As shown in FIG. 12A and FIG. 12B, the back-side frame 43 has a pair of right and left protrusions 43a on the upper side thereof. The protrusions 43a engage with the upper edge of the opening 31a (see FIG. 4B) by the engagement portions 31b (see FIG. 4B). The back-side frame 43 is attached to the front-side frame 42 (see FIG. 3) from the back ends of the press keys 41 (see FIG. 3), and receives the back ends of the press keys 41. The back-side frame 43 also has a back-side opening 43b through which the contact point 23a (see FIG. 3) of the contact member 23 can be inserted so as to be able to contact the back end of the press key 41.

As materials constituting the press key 41, the front-side frame 42, and the back-side frame 43, various types of resin materials may be used suitably.

Figure 13A:
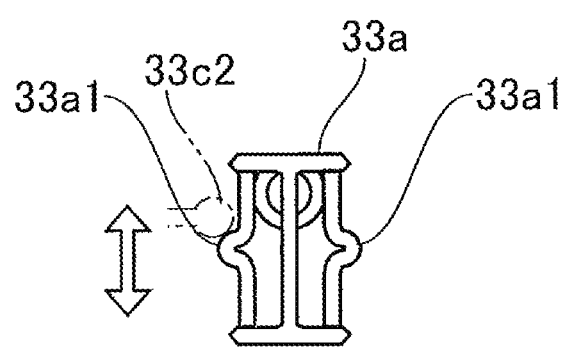
FIG. 13A is a plan view of a locking piece according to the embodiment.
Figure 13B:
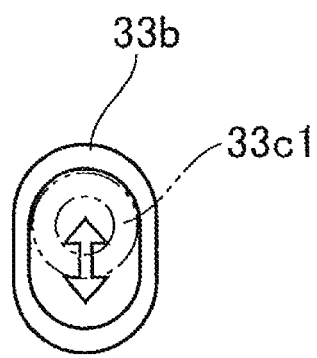
FIG. 13B is a plan view of an O ring.

As shown in FIG. 13A, the locking piece 33a is a component arranged in the recess 31c (see FIG. 4A), and has a locking projection 33a1 projecting sideways in an intermediate portion thereof. The locking projection 33a1 may be provided on both right and left sides of the locking piece 33a or on one of the right and left sides. As shown in FIG. 13B, the O ring 33b is formed in an elliptical shape corresponding to the shape of the long hole 31d (see FIG. 4A)

Figure 14A:
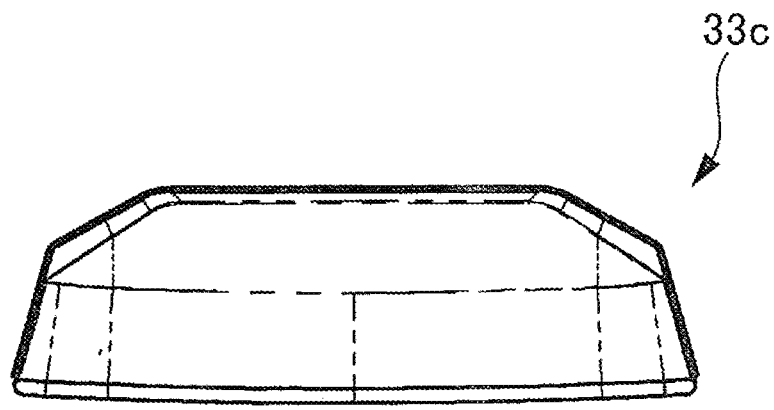
FIG. 14A is a plan view of a lock cover according to the embodiment.
Figure 14B:
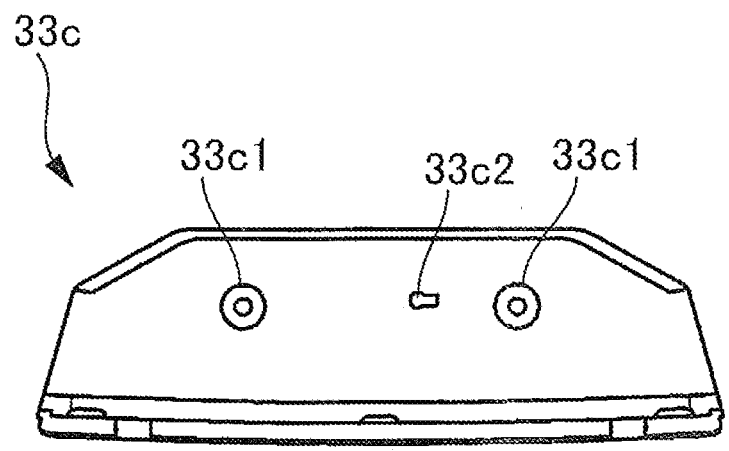
FIG. 14B is a rear view of the lock cover.

As shown in FIGS. 14A and 14B, the lock cover 33c is a cover body covering the locking piece 33a and the O ring 33b (see FIGS. 13A and 13B), and has a pair of right and left screw mounting portions 33c1 (boss portions) on the rear face side. Further, at a position corresponding to the locking projection 33a1 (see FIG. 13A) between the pair of right and left screw mounting portions 33c1, at least one locking rib 33c2 (in this example, one locking rib 33c2) is provided.

The lock cover 33c is configured such that the screw mounting portion 33c1 is inserted in the O ring 33b (see FIG. 3), and the lock cover 33c is screwed with the screws 13 (see FIG. 3) to the long hole 31d (see FIG. 4A) via a washer 13A (see FIG. 3). At this point, the screw mounting portion 33c1 is screwed so as to be movable in a direction of the opening 31a (see FIG. 3). The lock cover 33c screwed in this way is configured so as to lock the lower side 40a of the press-key unit 40 when it is moved in the direction of the opening 31a, and the locking rib 33c2 is locked to the locking projection 33a1 (see FIG. 13A). Thereby, it is restricted to move in a return direction.

(Action of Embodiment)

Action of the embodiment explained above will be described.

Figure 15:
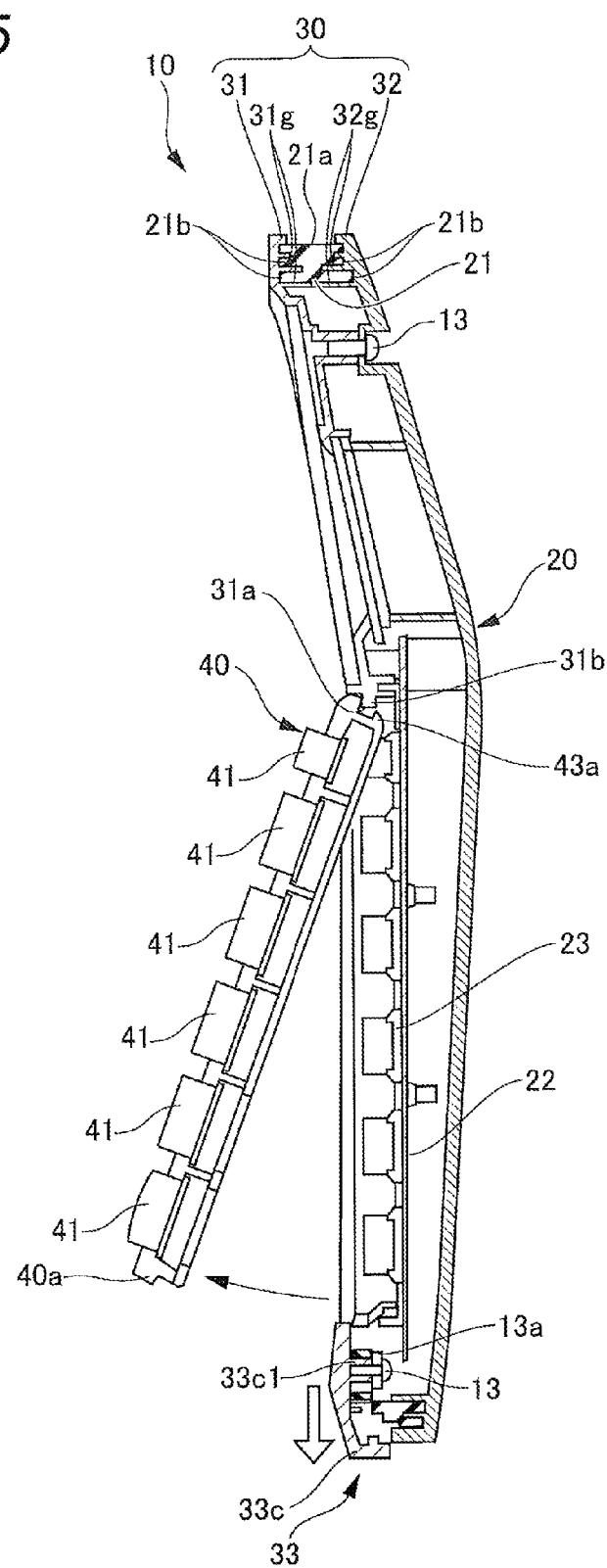
FIG. 15 is an action explanatory diagram of an electronic calculator.

As shown in FIG. 15, in the electronic calculator 10, by sliding the lock cover 33c in a direction away from the opening 31a, it is possible to easily remove the press-key unit 40 from the main body 20. Specifically, by sliding the lock cover 33c in a direction away from the opening 31a such that the locking rib 33c2 goes over the locking projection 33a1, and after releasing the lower side 40a of the press-key unit 40 from the lock by the lock cover 33c, the protrusion 43a is disengaged from the engagement portion 31b while turning the press-key unit 40 with the upper side being a fulcrum. Thereby, the press-key unit 40 can be pulled out from the main body 20 (front-side casing 31 in this example).

Accordingly, in the present embodiment, by disassembling the electronic calculator 10 into the main body 20 and the press-key unit 40, and washing the press-key unit 40 or wiping the surface of the contact member 23, cleaning can be made easily. As such, dusts or the like entering inside can be removed easily.

Further, as the outer peripheral rib 23b is compressed from three directions, the gap caused between the outer peripheral rib 23b and the U-shaped groove 31f can be further reduced. Consequently, as a high sealing property can be obtained, it is possible to realize more reliable waterproof performance and dustproof performance.

Further, in the portion where the thickness t1 of the packing member 21 is made thicker, as the grooves 31g and 32g formed in a plurality of layers in the front-side casing 31 and the back-side casing 32 and the linear ribs 21b of the packing member 21 are fitted, high waterproof performance and dustproof performance can be made by the complicated bypass structure. Moreover, it is possible to achieve an effect that the packing member 21 is made less likely to be detached from the front-side casing 31 and the back-side casing 32. While, in the above description, description has been made with use of an electronic calculator as an example, it is needless to say that the embodiment is applicable to other electronic devices such as an electronic dictionary and a mobile phone having keys. Further, the detachable press-key unit 40 may be a key unit in which the key operation unit is in an elastically deformable sheet, rather than one having respective keys.

What is claimed is:

1. An electronic device comprising:
  a casing having an opening;
  a circuit board having a plurality of electrodes, the circuit board being provided inside the casing;
  a contact member having a plurality of contact points corresponding to the electrodes, the contact member being provided so as to seal the opening; and
  a key unit having a key operation unit corresponding to the contact points, the key unit being provided to the opening;
  wherein the key unit is attached to the opening in an attachable and detachable manner, and the key unit includes:
    a plurality of press keys each having a flange on a back end, the press keys being provided to the key operation unit;
    a front-side frame having a front-side opening in which a tip end of each of the press keys is inserted, and a rib for securing a stroke when one of the press keys is pressed, the rib being provided around the front-side opening; and
    a back-side frame attached to the front-side frame from the back end side of the press keys, the back-side frame being configured to receive the back end of the press keys, and the back-side frame having a back-side opening in which a corresponding one of the contact points of the contact member is inserted in a manner contactable with the back end of a corresponding one of the press keys.

2. The electronic device according to claim 1, further comprising a lock unit configured to fix the key unit to the casing.

3. The electronic device according to claim 2, wherein the opening has a rectangular shape, the key unit has a frame having an approximately rectangular shape corresponding to the opening, and the lock unit is configured to hold down one side of the key unit so as to prevent the one side of the key unit from separating from the opening of the casing.

4. The electronic device according to claim 3, wherein the lock unit is configured to slide in a direction orthogonal to the one side of the key unit.

5. The electronic device according to claim 4, wherein:
the key unit has a first engagement portion on the one side of the key unit, and
the casing has a second engagement portion configured to engage with the first engagement portion, on an edge of the opening.

6. The electronic device according to claim 5, wherein the lock unit is provided on a lower side of the opening of the casing.

7. The electronic device according to claim 1, wherein the press keys include a number key and an operation key, and the electronic device is operable as an electronic calculator.

8. An electronic device comprising:
a casing having an opening;
a circuit board having a plurality of electrodes, the circuit board being provided inside the casing;
a contact member having a plurality of contact points corresponding to the electrodes, the contact member being provided so as to seal the opening;
a key unit having a key operation unit corresponding to the contact points, the key unit being provided to the opening; and
a lock unit configured to fix the key unit to the casing;
wherein:
the key unit is attached to the opening in an attachable and detachable manner,
the key unit has a frame having a shape corresponding to a shape of the opening, and the lock unit is configured to hold down one side of the key unit so as to prevent the one side of the key unit from separating from the opening of the casing,
the casing includes at least one hole formed on an edge of the opening at which the lock unit is provided, the hole having an edge for receiving an O ring, and
the lock unit includes:
an O ring arranged on the hole; and
a lock cover configured to lock the key unit, the lock cover being arranged so as to cover the O ring and being movably screwed to the hole of the casing via a screw mounting portion inserted in the O ring.

9. The electronic device according to claim 8, wherein:
the casing includes a plurality of holes,
the casing includes a recess formed in an intermediate portion between the holes formed on the edge of the opening,
the lock unit includes a locking piece arranged in the recess,
the locking piece includes a locking projection in an intermediate portion, and
the lock cover includes a locking rib configured to be locked to the locking projection of the locking piece.

10. An electronic device comprising:
a casing having an opening;
a circuit board having a plurality of electrodes, the circuit board being provided inside the casing;
a contact member having a plurality of contact points corresponding to the electrodes, the contact member being provided so as to seal the opening;

a key unit having a key operation unit corresponding to the contact points, the key unit being provided to the opening; and
a packing member;
wherein:
the key unit is attached to the opening in an attachable and detachable manner,
the casing includes a front-side casing having the opening, and a back-side casing to be joined with the front-side casing to constitute the casing,
the front-side casing includes a groove formed around the opening,
the contact member includes an outer peripheral rib which is insertable in the groove, the outer peripheral rib being formed around an outer periphery,
the packing member is provided along outer peripheries of the front-side casing and the back-side casing and interposed between the front-side casing and the back-side casing,
the front-side casing and the back-side casing include grooves into which the packing member is fitted, the grooves being formed along the outer peripheries,
in portions of an upper side and a lower side of the casing, the packing member is exposed to be visible from an outside,
in the front-side casing and the back-side casing, the grooves into which the packing member is fitted are formed in a plurality of layers at positions corresponding to the portions in which the packing member is exposed, and
exposed portions of the packing member include a plurality of linear ribs corresponding to the grooves formed in the plurality of layers.

11. The electronic device according to claim 10, wherein the outer peripheral rib is formed such that a tip end of the outer peripheral rib has a partial spherical shape in a sectional view and has a width larger than a width of a base end of the outer peripheral rib.

12. An electronic device comprising:
a casing having an opening;
a circuit board having a plurality of electrodes, the circuit board being provided inside the casing;
a contact member having a plurality of contact points corresponding to the electrodes, the contact member being provided so as to seal the opening;
a key unit having a key operation unit corresponding to the contact points, the key unit being provided to the opening; and
a lock unit configured to fix the key unit to the casing;
wherein:
the key unit is attached to the opening in an attachable and detachable manner,
the key unit has a frame having a shape corresponding to a shape of the opening, and the lock unit is configured to hold down one side of the key unit so as to prevent the one side of the key unit from separating from the opening of the casing,
the key unit includes:
a plurality of press keys each having a flange on a back end, the press keys being provided to the key operation unit;
a front-side frame having a front-side opening in which a tip end of each of the press keys is inserted, and a rib for securing a stroke when one of the press keys is pressed, the rib being provided around the front-side opening; and a back-side frame attached to the front-side frame from the back end side of the press keys, the back-side frame being configured to receive the back end of the press keys, and the back-side frame having a back-side opening in which a corresponding one of the contact points of the contact member is inserted in a manner contactable with the back end of a corresponding one of the press keys, the casing includes at least one hole formed on an edge of the opening at which the lock unit is provided, the hole having an edge for receiving an O ring, and the lock unit includes:
  an O ring arranged on the hole; and
  a lock cover configured to lock the key unit, the lock cover being arranged so as to cover the O ring and being movably screwed to the hole of the casing via a screw mounting portion inserted in the O ring.

13. An electronic device comprising:
a casing having an opening;
a circuit board having a plurality of electrodes, the circuit board being provided inside the casing;
a contact member having a plurality of contact points corresponding to the electrodes, the contact member being provided so as to seal the opening; and
a key unit having a key operation unit corresponding to the contact points, the key unit being provided to the opening;
wherein:
the key unit is attached to the opening in an attachable and detachable manner, and the key unit includes:
  a plurality of press keys each having a flange on a back end, the press keys being provided to the key operation unit;
  a front-side frame having a front-side opening in which a tip end of each of the press keys is inserted, and a rib for securing a stroke when one of the press keys is pressed, the rib being provided around the front-side opening; and
  a back-side frame attached to the front-side frame from the back end side of the press keys, the back-side frame being configured to receive the back end of the press keys, and the back-side frame having a back-side opening in which a corresponding one of the contact points of the contact member is inserted in a manner contactable with the back end of a corresponding one of the press keys, the casing includes a front-side casing having the opening, and a back-side casing to be joined with the front-side casing to constitute the casing, the front-side casing includes a groove formed around the opening, and the contact member includes an outer peripheral rib which is insertable in the groove, the outer peripheral rib being formed around an outer periphery.

* * * * *